(12) United States Patent
Namuduri et al.

(10) Patent No.: US 11,316,335 B2
(45) Date of Patent: Apr. 26, 2022

(54) ACTIVE DISCONNECT DEVICE

(71) Applicant: GM Global Technology Operations LLC, Detroit, MI (US)

(72) Inventors: Chandra S. Namuduri, Troy, MI (US); Rashmi Prasad, Troy, MI (US); Thomas W. Nehl, Shelby Township, MI (US); David J. Brooks, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 189 days.

(21) Appl. No.: 16/863,412

(22) Filed: Apr. 30, 2020

(65) Prior Publication Data

US 2021/0344187 A1 Nov. 4, 2021

(51) Int. Cl.
*H02H 3/08* (2006.01)
*H05K 1/18* (2006.01)

(52) U.S. Cl.
CPC ............. *H02H 3/08* (2013.01); *H05K 1/181* (2013.01); *H05K 2201/10151* (2013.01); *H05K 2201/10166* (2013.01)

(58) Field of Classification Search
CPC ............. H05K 1/18; H05K 1/181–187; H05K 2201/10155; H05K 2201/10166; H02H 9/00; H02H 9/04; H02H 3/08; H02H 3/087; H02H 3/0935; H01L 23/42; H01L 23/498; H01L 23/538
USPC ................. 361/93.1–93.9, 100–106
See application file for complete search history.

(56) References Cited

U.S. PATENT DOCUMENTS

| | | | |
|---|---|---|---|
| 6,522,510 B1* | 2/2003 | Finlay | H02H 3/338 361/42 |
| 2005/0083626 A1* | 4/2005 | Bruwer | H05B 47/185 361/93.1 |
| 2008/0225457 A1* | 9/2008 | Korrek | H01H 51/005 361/100 |
| 2014/0151146 A1* | 6/2014 | Tanaka | H01L 24/40 180/443 |
| 2014/0312691 A1* | 10/2014 | Doljack | H02J 7/0036 307/29 |
| 2015/0116875 A1* | 4/2015 | Biurrun Sotelo | H02J 7/0031 361/62 |
| 2015/0311815 A1* | 10/2015 | Nedic | H02M 7/003 363/21.01 |

(Continued)

*Primary Examiner* — Tuan T Dinh
(74) *Attorney, Agent, or Firm* — Vivacqua Crane PLLC

(57) ABSTRACT

A disconnect device includes a mounting plate having a thermally conductive substrate applied onto the mounting plate. A first layer of an electrically conductive material is applied onto the substrate. A semiconductor switch supported on the first layer connects or disconnects an input power source to or from a load. A second layer of an electrically conductive material applied onto the substrate is electrically isolated from the first layer. An electronic sensing, control and protection circuit is supported on the second layer and is connected to the semiconductor switch to control operation of the semiconductor switch. A control unit in communication with the electronic sensing, control and protection circuit via an electrically isolated control path provides control and communication between the electronic sensing, control and protection circuit and the semiconductor switch.

20 Claims, 4 Drawing Sheets

(56) References Cited

U.S. PATENT DOCUMENTS

| | | | |
|---|---|---|---|
| 2016/0087431 A1* | 3/2016 | Krumpholz | H02H 9/041 |
| | | | 361/56 |
| 2017/0330720 A1* | 11/2017 | Shea | H01H 9/443 |
| 2018/0049291 A1* | 2/2018 | Xu | H05B 47/11 |
| 2018/0156394 A1* | 6/2018 | Hsia | F21K 9/278 |
| 2020/0066686 A1* | 2/2020 | Mohn | H02M 7/003 |

* cited by examiner

ACTIVE DISCONNECT DEVICE

INTRODUCTION

The present disclosure relates to electrical system disconnect devices used to protect system wiring and components from overvoltage and overcurrent conditions.

Disconnect devices include circuit breakers, contactors and fuses. Conventional automatic disconnect devices such as circuit breakers are commonly used when a full current load is not intended to drop across the device if opened, to prevent arcing across the circuit breaker. Conventional fuses can actuate above rated current load, however fuses react to overcurrent conditions with a heat sensitive material that melts to break an electrical circuit and protect electrical wiring and components. High voltage (HV), e.g., >300 Vdc, high current (>30 A) fuses and circuit breakers are typically bulky and have slow response times defining approximately 5 milliseconds (ms) or greater and are limited in temperature response time and current limits required to heat the fuse material to melting temperature. Fuses have several drawbacks. Fuses are passive devices which cannot be automatically or otherwise reset and the current required to open a fuse although predetermined may vary widely under actual use conditions. Once actuated, fuses require manual replacement and therefore require physical access be provided when positioning them in a system. In addition, fuse response time variance may lead to excessive fault current in battery powered systems such as in electrical vehicles under certain fault conditions such as a HV battery short circuit.

Thus, while current disconnect devices achieve their intended purpose, there is a need for a new and improved disconnect device and method for operating a disconnect device.

SUMMARY

According to several aspects, a disconnect device includes a mounting plate or a printed circuit board having: a semiconductor switch supported on the mounting plate connecting or disconnecting an input power source to or from a load; and an electronic sensing, control and protection circuit supported on the mounting plate or the printed circuit board and connected to the semiconductor switch to control operation of the semiconductor switch. A control unit in communication with the electronic sensing, control and protection circuit via an electrically isolated control path to provide control and communication between the electronic sensing, control and protection circuit and the semiconductor switch.

In another aspect of the present disclosure, the electronic sensing, control and protection circuit generates an active control signal to the semiconductor switch.

In another aspect of the present disclosure, the active control defines a commanded active disconnect open under non-electrical fault conditions.

In another aspect of the present disclosure, the electronic sensing, control and protection circuit defines a passive or autonomous control of the semiconductor switch.

In another aspect of the present disclosure, the semiconductor switch, the electronic sensing, control and protection circuit and the control unit include no moving parts.

In another aspect of the present disclosure, an electrically non-conductive covering is provided about the disconnect device, the covering defining a polymeric material.

In another aspect of the present disclosure, an electrically isolated thermally conductive substrate is applied to the mounting plate. The semiconductor switch is mounted to electrically conductive layers attached on top of the electrically insulated substrate.

In another aspect of the present disclosure, a programmable trip current vs time is applied by the control unit to command disconnect of the load from the power source.

In another aspect of the present disclosure, the semiconductor switch is operable to open in 0.2 ms or less upon receipt of an open command.

In another aspect of the present disclosure, the disconnect device continuously or at a predetermined time interval communicates the disconnect device status to the control unit via the control path.

According to several aspects, a disconnect device for an automobile vehicle includes a mounting plate having a thermally conductive and electrically insulating substrate applied onto the mounting plate. A first layer of an electrically conductive material is applied onto the substrate. A semiconductor switch supported on the first layer connects or disconnects an input power source to or from a load. A second layer of an electrically conductive material applied onto the substrate is electrically isolated from the first layer. An electronic sensing, control and protection circuit is supported on the second layer and is connected to the semiconductor switch to control operation of the semiconductor switch. A control unit in communication with the electronic sensing, control and protection circuit via an electrically isolated control path provides control and communication between the electronic sensing, control and protection circuit and the semiconductor switch.

In another aspect of the present disclosure, a switch driver and a controller connected to the second layer are in communication with the semiconductor switch.

In another aspect of the present disclosure, the switch driver and the controller provide built-in sensing and protection against overvoltage and thermal overload during repeated reconnection and disconnection of the load when faulted.

In another aspect of the present disclosure, the controller includes a trip-current vs time set point disconnecting the load from the input power source when the set point is reached.

In another aspect of the present disclosure, a printed circuit board and a signal connector are connected to the second layer, the printed circuit board providing communication between the power switch and the switch driver and the controller and the signal connector.

In another aspect of the present disclosure, the signal connector is in communication with the control unit, the control unit generating voltage bias power and control signals for operation of the power switch.

In another aspect of the present disclosure, a first conductive bus bar is connected to the first layer providing connection to the input power source. A second conductive bus bar is connected to the second layer and to the load.

According to several aspects, a method for operating a disconnect device includes: installing a thermally conductive, electrically insulated substrate onto a mounting plate; attaching a first layer of an electrically conductive material onto the substrate; supporting a semiconductor switch on the first layer acting to connect or disconnect an input power source to or from a load; electrically isolating a second layer of an electrically conductive material on the substrate from the first layer; connecting an electronic sensing, control and protection circuit to the second layer and to the semiconductor switch to control operation of the semiconductor switch; and providing a control unit in communication with the electronic sensing, control and protection circuit via an electrically isolated control path to provide control and communication between the electronic sensing, control and protection circuit and the semiconductor switch.

In another aspect of the present disclosure, the method further includes generating voltage bias power and control signals by the control unit for operation of the power switch.

In another aspect of the present disclosure, the method further includes opening the switch to disconnect the load from the input power source when a load current exceeds a predetermined value with respect to time under overload or short circuit conditions.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
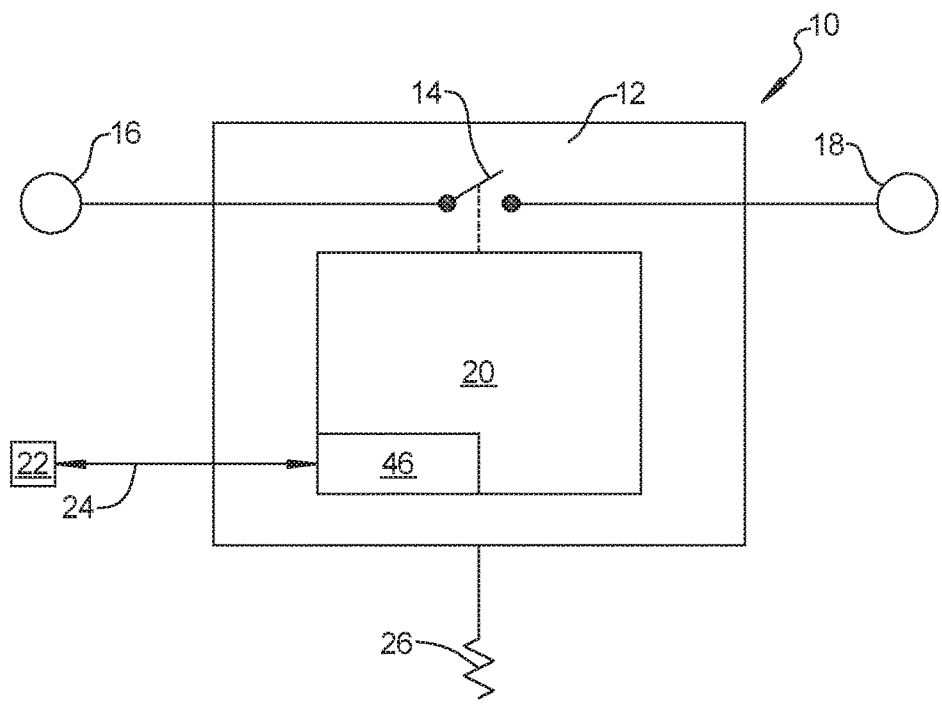
FIG. 1 is a diagrammatic presentation of a disconnect device according to an exemplary aspect.

Referring to FIG. 1, a system and method of operation of an active disconnect 10 includes a disconnect device 12 having a low-loss semiconductor switch 14 which connects or disconnects an input power source 16 to or from an output also defined as a load 18. According to several aspects the disconnect device 10 may be used to disconnect features or elements of an electrical system of an automobile vehicle. The semiconductor switch 14 may include a plurality of semiconductor dies using a semiconductor material, such as silicon, silicon carbide, gallium oxide, and gallium nitride, to form a MOSFET or an IGBT. The disconnect device 12 may be capable of blocking high voltage in a single direction or both directions during an off-state. An electronic sensing, control and protection circuit 20 is connected to and provides either an active level of control or a passive level of control operation of the semiconductor switch 14. The electronic sensing, control and protection circuit 20 is in communication with a control unit 22 such as a system controller via a control path 24 to provide control and communication with the electronic sensing, control and protection circuit 20. The disconnect device 12 is also connected to a ground 26. According to several aspects, the disconnect device 12 is a resettable, programmable electronic disconnect without any moving parts.

Figure 1A:
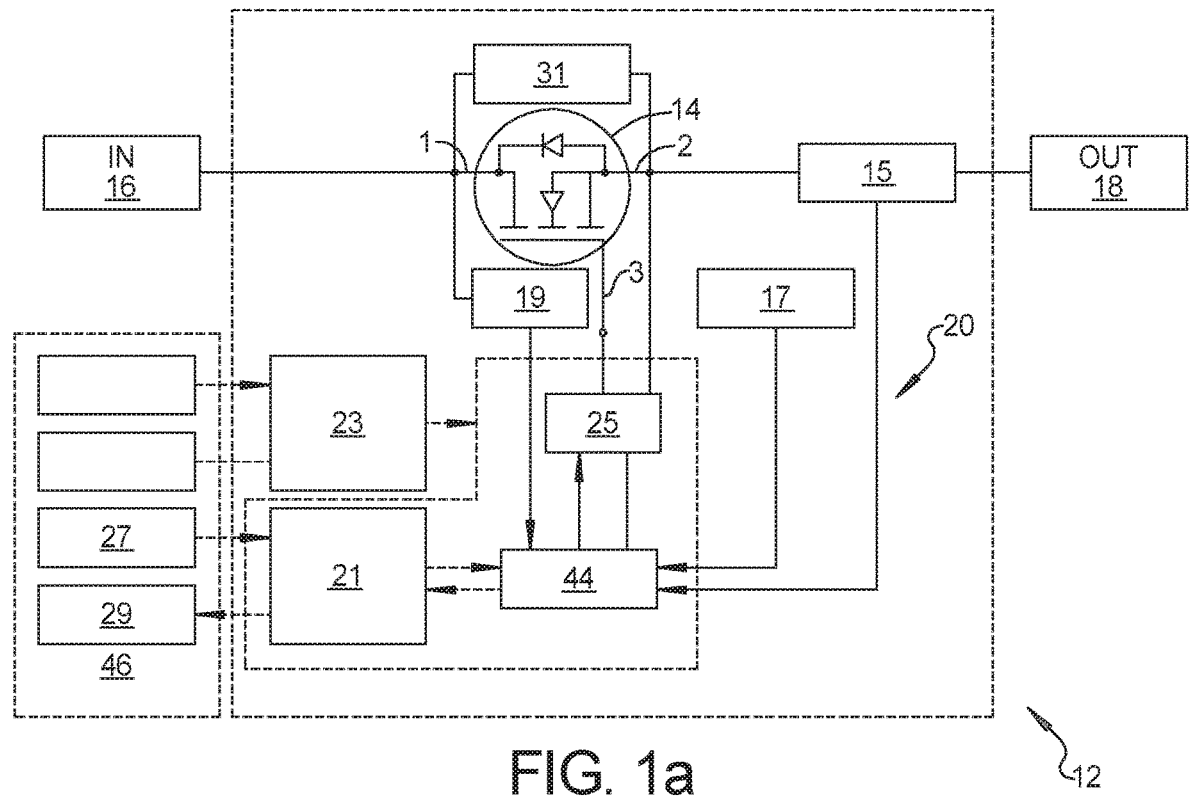
FIG. 1a is a detailed schematic representation of the disconnect device of FIG. 1.
Figure 1B:
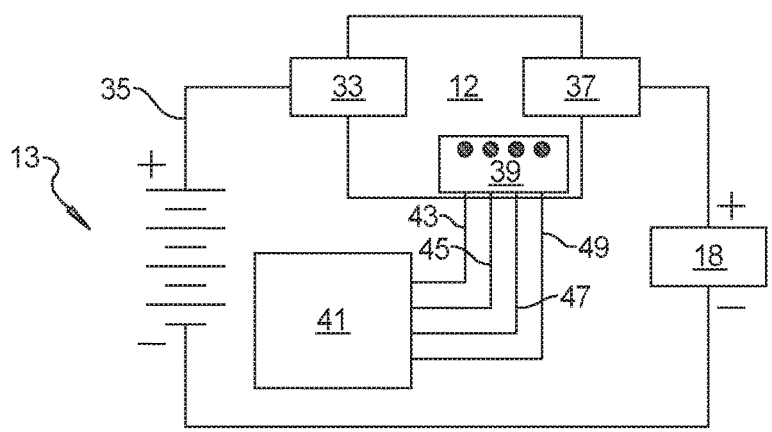
FIG. 1b is a schematic application of the disconnect device of FIG. 1 in a high voltage battery powered load circuit.

Referring to FIGS. 1a and 1b, schematic diagrams are presented of an exemplary active disconnect device 12 suitable for a direct current (DC) load powered by a high voltage (HV) DC power source. From FIG. 1a, the exemplary disconnect device consists of a semiconductor power switch 14, various sensors including a current sensor 15, a thermal sensor 17, and a voltage sensor 19, a signal interface connector 21, a power supply 23, a switch driver 25 and control blocks 27. A single or a plurality of power MOSFET (s) (Metal Oxide Semiconductor Field Effect Transistor) in parallel serve as the power switch 14 between the input 16 and output 18 terminals. A drain or terminal(s) 1 of the MOSFET(s) is connected to the input power terminal 16 and a source or terminal(s) 2 of the MOSFET(s) is connected to the output load terminal 18 through the current sensor 15 which can be a resistive shunt, a hall effect sensor, a magneto-resistive sensor or other suitable sensor which generates a signal proportional to the current carried through the switch to the load.

The signal connector 46 interfaces the active disconnect switch 12 with the external controller 22 in FIG. 1 to receive bias power, Ground (Gnd) and Command inputs and to provide switch status feedback. A bias power supply voltage with respect to ground is 3.3V to 24V and more preferably in a range between 5V to 15V and is utilized by a galvanically isolated power supply to generate regulated power (e.g., 5 to 15V) to the sensor, controller and driver circuits which are referenced to the output terminal 18 or the power switch terminal 2.

Command signals 27 and status signals 29 on a system controller side pass through the signal isolators 21 within the switch controller 44 to provide galvanic isolation from the high voltages on the switch terminals which could be operating at voltages ranging from 200V to 900V above the ground potential. The isolated output command signal 27 is used by a switch control block to actively turn-off the power switch via the switch driver. In addition, the switch control block receives output signals from the voltage sensor 19, the current sensor 15 and the temperature sensor 17 and identifies if a fault condition is present that will be latched and used to turn off the power switch 12 and report to a system controller 54 described in reference to FIG. 3 via a status line 56 through the signal isolator 21.

The controller logic 44, the switch driver 25 and the signal isolators 21 may be integrated within a single chip IC (integrated circuit) or as a multi-chip module to minimize package size and cost. A passive overvoltage protection circuit for the power switch 14 may also be incorporated in the active disconnect device 12 in the form of a resistor-capacitor snubber 31 or a transient voltage suppressor (TVS) Zener diode voltage clamp connected across the power switch terminals 1 and 2 to limit a transient voltage during load disconnect under over current fault.

FIG. 1b further shows a typical connection of an active disconnect device 12 in an HV battery 13 powered load circuit. An input terminal 33 is connected to a positive battery terminal 35 and an output terminal 37 is connected to a positive load terminal 37 of the load 18. A signal connector 39 is interfaced with a system controller 41 to receive a bias power signal 43, a ground signal 45 and command signals 47 and to send a device status feedback 49 through galvanic isolation as explained previously. It is also envisioned to use a single signal line that can be used for bi-directional communication of the command and status using an open collector type logic signal to minimize cost.

Referring to FIG. 2 and again to FIG. 1, the disconnect device 12 may be provided in multiple configurations to suit operational requirements and a space envelope allowed for the device. According to several aspects the disconnect device 12 includes a mounting plate 28 made for example of aluminum having an electrically isolated thermally conductive substrate 30 applied thereto. A first layer 32 of an electrically conductive material such as an etched copper is applied onto the substrate 30. A first conductive bus bar 34 made for example of copper is connected to the first layer 32 and provided for connection to the input power source 16. The semiconductor switch 14 described in reference to FIG. 1 according to several aspects defines a power switch 36 also connected to the first layer 32. According to several aspects the power switch 36 may a low-loss power semiconductor switch of predetermined characteristics including but not limited to voltage, current, switching speed, size and the like.

A second layer 38 of an electrically conductive material similar to the first layer 32 such as an etched copper is also applied onto the substrate 30 which is separated from and therefore electrically isolated from the first layer 32. A second conductive bus bar 40 made for example of copper is connected to the second layer 38 and to the load 18. Also connected to the second layer 38 are a printed circuit board 42, a switch driver and controller 44 and a signal connector 46. The printed circuit board 42 provides communication between the power switch 36 and the switch driver and controller 44 and the signal connector 46. The switch driver and controller 44 provides built-in sensing and protection against overvoltage and thermal overload in the event of repeated reconnection and disconnection of a faulted load and may include a trip-current vs time set point for disconnecting the load 18 from the input power source 16. The trip-current vs time set point may be temperature independent or temperature dependent. The disconnect device 12 has a high sensing speed and a fast-response defined as ms response time. According to several aspects, the power switch 36 is a low loss semiconductor switch which may be a Silicon Si insulated-gate bipolar transistor (IGBT), a SiC metal-oxide-semiconductor field-effect-transistor (MOSFET), a GaN field-effect-transistor (FET), or the like of predetermined characteristics coupled with high speed electronic sensing, control and protection circuit. It is also envisioned to utilize suitable analog and digital logic circuitry in place of the controller 44 to achieve the desirable protection and fault detection function to disconnect the power switch 36. Passive overvoltage protection devices such as resistor-capacitor (R-C) snubbers and/or transient voltage suppressor (TVS) device(s) may also be incorporated (not shown) across the first and second power terminals of the power switch.

Figure 2:
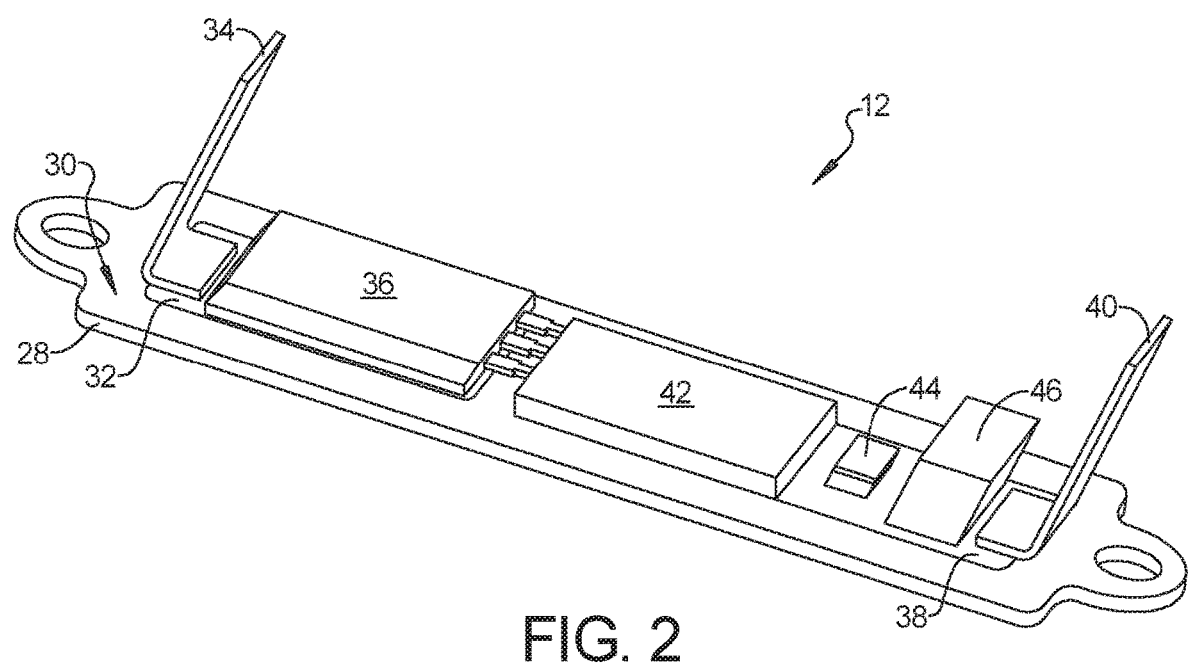
FIG. 2 is a right perspective view of an exemplary disconnect device of FIG. 1.

Referring to FIG. 3 and again to FIGS. 1 and 2, the power switch 36 may include multiple conductor members, which according to several aspects include a first conductor member 48 defining a first power terminal, a second conductor member 50 defining a second power terminal and a third conductor member 52 defining a gate or control terminal. The third conductor member 52 communicates with the driver and controller 44. The controller 44 also communicates with the signal and power connector 46. The controller 44 and the signal and bias power connector 46 are in communication with a system controller 54 which generates low voltage bias power and control signals ranging from approximately zero to the bias power supply voltage level which can be typically between 3.3V to 24V and more preferably between 5V to 15V for operation of the power switch 36. A signal or communication link 56 provides an electrically isolated communication path between the system controller 54 and the signal connector 46, to receive command and/or to provide status feedback.

According to several aspects, a device status of the disconnect device 12 may be communicated between the disconnect device 12 and the system controller 54. The device status may include but is not limited to the power switch 36 being open or closed. The device status may be used by the system controller 54 to generate a control command signal used to close the power switch 36 to reconnect the disconnect device 12 to the load 18 either remotely or automatically after a programmable period of time following disconnection of the disconnect device 12 from the load 18. The disconnect device 12 may be disconnected with the power switch 36 open due for example to an AC or DC high voltage above a predetermined threshold, an over-current condition above a predetermined current threshold or a short circuit fault across the load.

The system controller 54 may perform multiple functions. These functions include but are not limited to commanding active disconnect open under non-electrical fault conditions such as during an air-bag deployment to prevent a thermal event. The functions may also include reprogramming characteristics of the disconnect device 12 if parameters of a vehicle that the disconnect device 12 is connected to are updated, for example using over-the-air transmission signals. The functions may further include commanding open the disconnect device 12 following an electrical vehicle (EV) accident initiated by an accelerometer signal to provide over-current protection of the battery system preempting a battery fault. According to several aspects, the system controller 54 may be separate from the disconnect device 12 or may be incorporated in the space envelope of the disconnect device 12.

As previously noted the switch controller 44 and the signal connector 46 are in communication with the system controller 54 which provides bias power and control signals for operation of the power switch 36. Control signals may be biased, for example zero volts or low defining the power switch 36 open position and 5 or 12 volts or high defining the power switch 36 closed position using for example a pull-up resistor 58 connected to a voltage source 60 such as a 5 Volt DC or a 12 Volt DC source.

Figure 3:
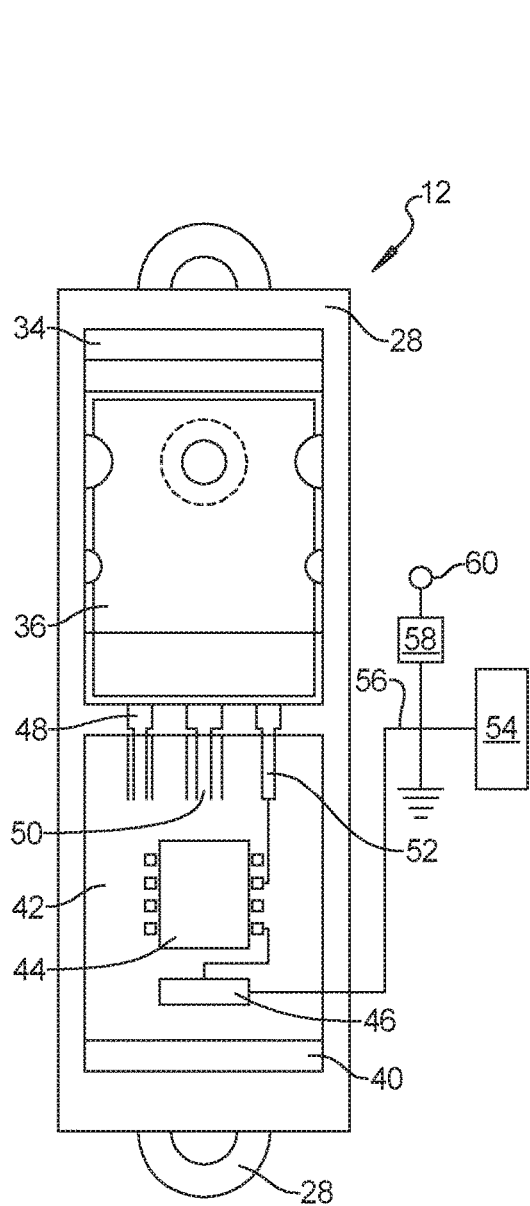
FIG. 3 is a top plan view of the disconnect device of FIG. 2.
Figure 4:
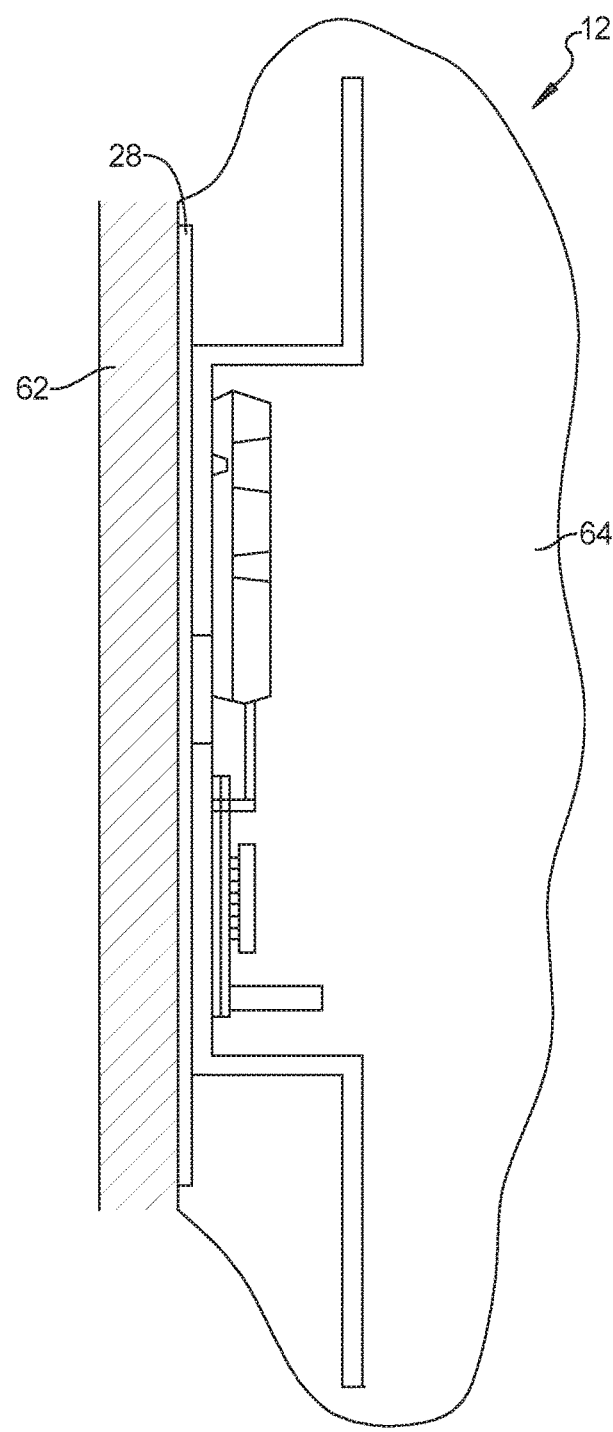
FIG. 4 is a side elevational partial cross-sectional view of the disconnect device of FIG. 2.

Referring to FIG. 4 and again to FIGS. 2 and 3, a voltage drop across the power semiconductor switch 36 within the disconnect device 12 generates heat during operation, therefore the mounting plate 28 is made of a thermally conductive material to enhance heat transfer away from the disconnect device 12. To further enhance heat transfer the mounting plate 28 may be attached to a heatsink 62 to conduct heat via the mounting plate 28 into the heatsink 62 and away from the disconnect device 12. To provide environmental protection for the disconnect device 12, such as resistance to atmospheric or environmental moisture and resistance to electrical shorting, an electrically non-conductive covering 64 may be provided about the disconnect device 12, such as a poured, sprayed or overmolded polymeric or epoxy material.

Figure 5:
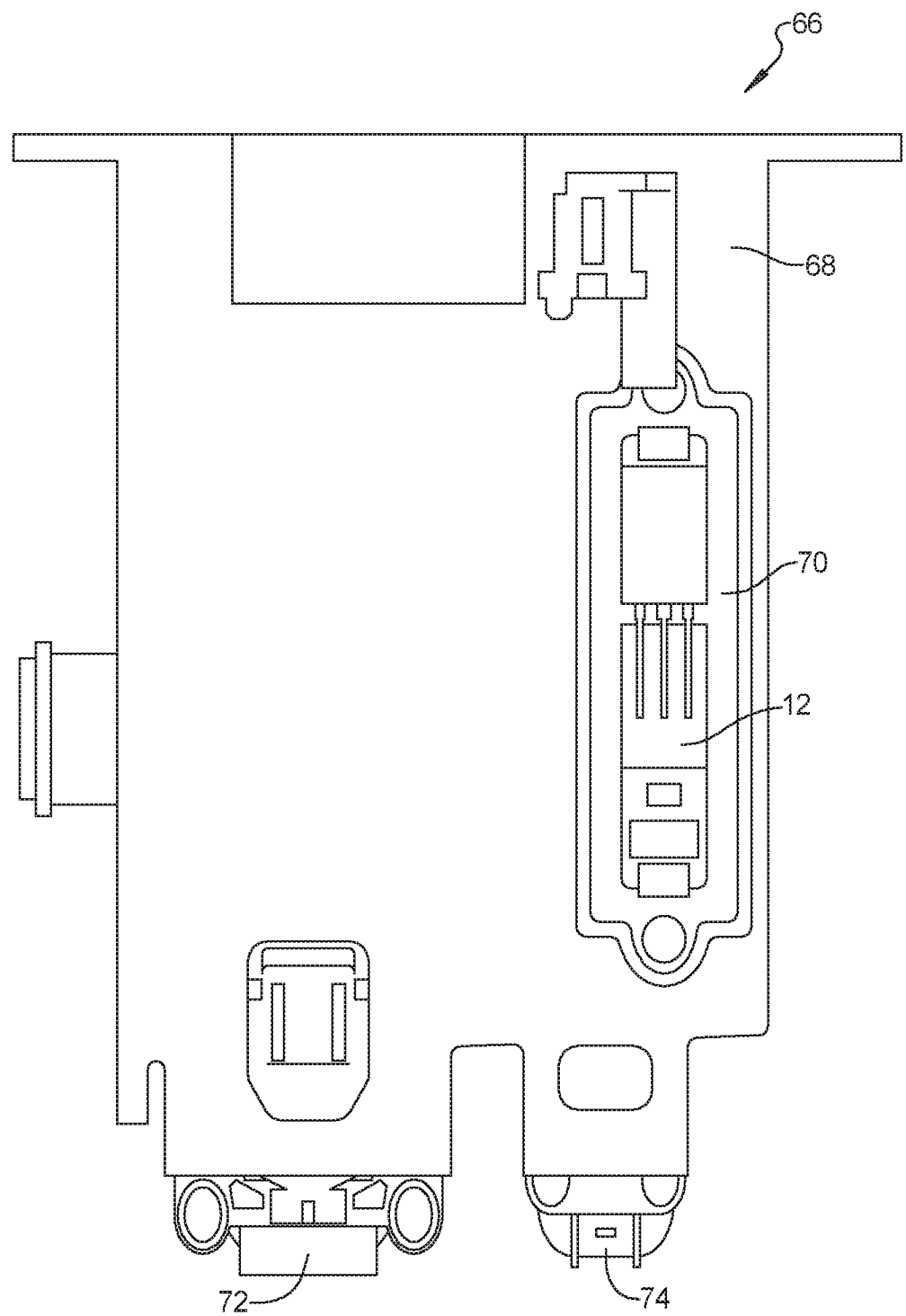
FIG. 5 is a front elevational view of a module housing incorporating the disconnect device of FIG. 2.

Referring to FIG. 5 and again to FIGS. 1 through 4, a disconnect device 12 of the present disclosure may be sized to be incorporated into a common system module housing 66 such as a traction power inverter module (TPIM) used for example for vehicle drive motor control, or to a similar module used for heating or air conditioning control. The housing 66 includes a port 70 normally providing access for a fuse, which may be modified to incorporate the disconnect device 12 without the requirement for access to remove or replace the disconnect device 12. This precludes environmental elements such as moisture and dirt from entering the housing 66 and impacting operation of the disconnect device 12 or other HV power electronic components within the housing 66. The further addition of the electrically non-conductive covering 64 described in reference to FIG. 4 further mitigates against environmental elements impacting operation of the disconnect device 12. The housing 66 commonly includes a power port 72 providing a sealed connection to the incoming positive and negative high voltage (HV) cables coming from the HV battery. The housing 66 may also include an output HV port 74 providing a sealed connection to the outgoing positive and negative high voltage (HV) leads to the load. The first power terminal 34 and the second power terminal 40 of the disconnect device 12 are connected between the positive terminal of the input power port 72 and the positive power terminal of the output power port 74 respectively.

According to several aspects, the control circuit including the controller 44 of the disconnect device 12 provides a programmable trip current vs time for disconnecting the load 18 from the source 16 that is essentially temperature independent. The disconnect device 12 may continuously or at a predetermined time interval communicate a disconnect device status to the system controller 54. Following disconnection by opening the power switch 36 the disconnect device 12 may be reconnected by closing the power switch 36 remotely by a signal from the system controller 54. The disconnect device 12 may also be reconnected autonomously, for example following a predetermined period of time upon receipt of a switch open command signal which may be initiated by a signal from the controller 44.

According to several aspects, the sensing and control characteristics of a disconnect device 12 permits operation at temperature, voltage and amperage conditions exceeding known operation limits of fuses. For example, the disconnect device 12 may operate up to 125 degrees C. @ $Voltage_{IN}$: 450V, and a $Current_{OUT}$: 50 Amp. The disconnect device 12 may also be preprogrammed to operate above these values for predetermined periods of time without opening the power switch 36, for example to allow for a short duration rapid vehicle acceleration drawing high current of for example 100 Amp during operation of an electric vehicle.

A disconnect device 12 of the present disclosure offers several advantages. These include a fast active disconnect device without any moving contacts for either a direct current (DC) or an alternating current (AC) high voltage, high current electrical circuit to protect the circuit and system against over current and short circuit faults. The disconnect device employs discrete or integrated low loss power semiconductor switch(es) of predetermined characteristics such as voltage, current, switching speed, size, and the like in conjunction with high speed electronic sensing, control and a protection circuit to safely disconnect a load from a source when a load current exceeds a predetermined value with respect to time under overload or short circuit conditions. The disconnect device may be supplied with a low voltage bias-power from a system controller and may communicate a disconnect device status to the controller and can be reconnected remotely or autonomously after a programmable or predefined period of time. The disconnect device 12 has built-in sensing and/or protection against overvoltage and thermal overload in case of repeated reconnection and disconnection of a faulted load.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A disconnect device for an automobile vehicle, comprising:
   a mounting plate having:
      a thermally conductive and electrically insulated substrate applied onto the mounting plate;
      a first layer of an electrically conductive material applied onto the substrate;
      a semiconductor switch supported on the first layer connecting or disconnecting an input power source to or from a load;
      a second layer of an electrically conductive material applied onto the substrate electrically isolated from the first layer; and
      an electronic sensing, control and protection circuit supported on the second layer and connected to the semiconductor switch to control operation of the semiconductor switch; and
   a control unit in communication with the electronic sensing, control and protection circuit via an electrically isolated control path to provide control and communication between the electronic sensing, control and protection circuit and the semiconductor switch.

2. The disconnect device for the automobile vehicle of claim 1, wherein the electronic sensing, control and protection circuit generates an active control of the semiconductor switch, and wherein the active control defines a commanded active disconnect open under non-electrical fault conditions.

3. The disconnect device for the automobile vehicle of claim 1, wherein the electronic sensing, control and protection circuit defines a passive control of the semiconductor switch.

4. The disconnect device for the automobile vehicle of claim 1, wherein the semiconductor switch, the electronic sensing, control and protection circuit and the control unit include no moving parts.

5. The disconnect device for the automobile vehicle of claim 1, further including an electrically non-conductive covering provided on the disconnect device, the covering defining a polymeric material.

6. The disconnect device for the automobile vehicle of claim 1, wherein the semiconductor switch is operable to open in 0.2 ms or less upon receipt of an open command.

7. The disconnect device for the automobile vehicle of claim 1, further including a disconnect device status wherein the disconnect device continuously or at a predetermined time interval communicates the disconnect device status to the control unit via the control path.

8. The disconnect device for the automobile vehicle of claim 1, further including a switch driver and a controller connected to the second layer in communication with the semiconductor switch, wherein the switch driver and the controller provide built-in sensing and protection against overvoltage and thermal overload during repeated reconnection and disconnection of the load when faulted.

9. The disconnect device for the automobile vehicle of claim 1, wherein the semiconductor switch includes at least one semiconductor die using a semiconductor material including at least one of silicon, silicon carbide, gallium oxide, and gallium nitride to form a MOSFET, an IGBT or a JFET, the disconnect device blocking high voltage in a single direction or both directions during an off-state.

10. The disconnect device for the automobile vehicle of claim 1, further including:
  a first conductive bus bar connected to the first layer and providing a connection to the input power source; and
  a second conductive bus bar connected to the second layer and to the load.

11. The disconnect device for the automobile vehicle of claim 8, wherein the controller includes at least one of:
  a trip-current vs time set point disconnecting the load from the input power source when the set point is reached;
  a trip-current and voltage vs time set point disconnecting the load from the input power source when the set point is reached; and
  a trip-current and temperature vs time set point disconnecting the load from the input power source when the set point is reached.

12. The disconnect device for the automobile vehicle of claim 8, further including a printed circuit board and a signal connector connected to the second layer, the printed circuit board providing communication between the semiconductor switch and the switch driver and the controller and the signal connector.

13. The disconnect device for the automobile vehicle of claim 3, wherein the signal connector is in communication with the control unit, the control unit generating voltage bias power and control signals for operation of the power switch.

14. A method for operating a disconnect device, comprising:
  installing a thermally conductive substrate onto a mounting plate;
  attaching a first layer of an electrically conductive material onto the substrate;
  supporting a semiconductor switch on the first layer acting to connect or disconnect an input power source to or from a load;
  electrically isolating a second layer of an electrically conductive material on the substrate from the first layer;
  connecting an electronic sensing, control and protection circuit to the second layer and to the semiconductor switch to control operation of the semiconductor switch; and
  providing a control unit in communication with the electronic sensing, control and protection circuit via an electrically isolated control path to provide control and communication between the electronic sensing, control and protection circuit and the semiconductor switch.

15. The method of claim 14, wherein supporting a semiconductor switch further comprises supporting a semiconductor switch having at least one semiconductor die using a semiconductor material including silicon, silicon carbide, gallium oxide, and gallium nitride to form a MOSFET, an IGBT or a JFET.

16. The method of claim 14, further including generating voltage bias power and control signals by the control unit for operation of the semiconductor switch.

17. The method of claim 14, further including providing an electrically non-conductive covering on the disconnect device, the covering defining a polymeric material.

18. The method of claim 14, wherein supporting a semiconductor switch further comprises supporting a semiconductor switch which is operable to open in 0.2 ms or less upon receipt of an open command.

19. The method of claim 14, further including providing a disconnect device status wherein the disconnect device continuously or at a predetermined time interval communicates the disconnect device status to the control unit via the control path.

20. The method of claim 16, further including opening the semiconductor switch to disconnect the load from the input power source when a load current exceeds a predetermined value with respect to time under overload or short-circuit conditions.

* * * * *